(12) United States Patent
Spindler et al.

(10) Patent No.: US 7,816,859 B2
(45) Date of Patent: Oct. 19, 2010

(54) WHITE LIGHT TANDEM OLED

(75) Inventors: Jeffrey P. Spindler, Rochester, NY (US); Tukaram K. Hatwar, Penfield, NY (US)

(73) Assignee: Global OLED Technology LLC, Wilmington, DE (US)

( * ) Notice: Subject to any disclaimer, the term of this patent is extended or adjusted under 35 U.S.C. 154(b) by 491 days.

(21) Appl. No.: 11/741,911

(22) Filed: Apr. 30, 2007

(65) Prior Publication Data

US 2008/0268282 A1    Oct. 30, 2008

(51) Int. Cl.
*H01J 1/62* (2006.01)
(52) U.S. Cl. .................... 313/504; 313/506; 428/690
(58) Field of Classification Search ......... 313/504–506; 428/690
See application file for complete search history.

(56) References Cited

U.S. PATENT DOCUMENTS

| | | | |
|---|---|---|---|
| 4,769,292 | A | 9/1988 | Tang et al. |
| 4,885,211 | A | 12/1989 | Tang et al. |
| 5,683,823 | A | 11/1997 | Shi et al. |
| 6,107,734 | A | 8/2000 | Tanaka et al. |
| 6,337,492 | B1 | 1/2002 | Jones et al. |
| 6,717,358 | B1 | 4/2004 | Liao et al. |
| 6,903,378 | B2 | 6/2005 | Cok |
| 2003/0045676 | A1 | 3/2003 | Kingston et al. |
| 2003/0189401 | A1 | 10/2003 | Kido et al. |
| 2006/0003184 | A1* | 1/2006 | Hatwar et al. ............. 428/690 |

FOREIGN PATENT DOCUMENTS

| | | |
|---|---|---|
| JP | 07-142169 | 6/1995 |
| JP | 2003-045676 | 2/2003 |
| WO | 2005/115059 | 12/2005 |

OTHER PUBLICATIONS

Tokito et al., *High-Efficiency White Phosphorescent Organic Light-Emitting Devices with Greenish-Blue and Red-Emitting Layers*, App. Phys. Lett., vol. 83, No. 12, Sep. 22, 2003, pp. 2459-2461.
Matsumoto, T., et al, *27.5L: Late-News Paper: Multiphoton Organic EL Device Having Charge Generation Layer*, SID 03 Digest, 2003, pp. 979-981.
Kido et al., *White Light-Emitting Organic Electroluminescent Devices Using the Poly (N- Vinylcarbazole) Emitter Layer Doped with Three Fluorescent Dyes*, Appl. Phys. Lett., vol. 64, No. 7, Feb. 14, 1994, pp. 815-817.

* cited by examiner

*Primary Examiner*—Nimeshkumar D. Patel
*Assistant Examiner*—Mary Ellen Bowman
(74) *Attorney, Agent, or Firm*—Morgan Lewis & Bockius LLP

(57) ABSTRACT

A tandem white light-emitting OLED device is disclosed comprising a spaced anode and cathode, a light reflector associated with either the anode or the cathode, and at least two white light emitting units. The first white light-emitting unit has a set of at least two emission peaks in the blue and yellow spectral regions that are more intense than any other emission peaks that may be present in the emission spectrum of the first white light-emitting unit. The second white light-emitting unit is disposed closer to the reflector than the first white light-emitting unit and includes a set of at least three emission peaks in the blue, green, and red spectral regions that are more intense than any other emission peaks that may be present in the emission spectrum of the second white light-emitting unit. An intermediate connector is disposed between the first and second white light-emitting units.

5 Claims, 6 Drawing Sheets

WHITE LIGHT TANDEM OLED

CROSS REFERENCE TO RELATED APPLICATIONS

Reference is made to commonly assigned U.S. patent application Ser. No. 11/393,767, filed Mar. 30, 2006, entitled "Efficient White-Light OLED Display With Filters", the disclosure of which is incorporated herein by reference.

FIELD OF THE INVENTION

The present invention relates to white light-emitting OLED devices having a tandem architecture.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for white light-emitting OLEDs to be incorporated into various applications, such as a solid-state lighting source, color display, or a full color display. By white light emission, it is meant that an OLED emits sufficiently broad light throughout the visible spectrum so that such light can be used in conjunction with filters to produce a full color display. In the case of OLED displays, the use of white OLEDs with color filters provides a simpler manufacturing process than an OLED having separately patterned red, green, and blue emitters. This can result in higher throughput, increased yield, and cost savings. White OLEDs have been reported in the prior art, such as reported by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve white light emission from an OLED, it is usually required that more than one type of molecule has to be excited, because each type of molecule typically emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants need to be carefully controlled. This produces manufacturing difficulties. A white OLED having two or more light-emitting layers can have better color as well as better luminance efficiency than a device with one light, and the dopant concentration variability tolerance is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks. It is known to use a third light-emitting layer to provide a third intensive emission peak.

For certain applications, e.g. televisions, color reproduction is very important. Not only is it important to have effective efficiency, but the color purity of light after passing through a filter needs to be excellent. This is achieved through the use of very narrow band pass color filters. Unfortunately, this wastes a large portion of the emitted light resulting in very low power efficiency. Typically, color filters are designed to have relatively broadband pass. Quite commonly, the band pass of color filters for display applications overlap in certain portions of the spectrum. For example, the blue and green filters can both permit some light in the blue-green portion. This greatly enhances the brightness of light passing through the filter, but it also can lead to unwanted color contamination resulting in desaturated primary colors.

Recently, a tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and in U.S. Patent Publication 2003/0189401 A1, and Liao et al. in U.S. Pat. No. 6,717,358 and U.S. Patent Application Publication 2003/0170491 A1, the disclosures of which are herein incorporated by reference. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID* 03 *Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units. Although color emission and luminance efficiency is improved, this tandem white OLED cannot be made with less than three EL units, implying that it requires a drive voltage at least 3 times as high as that of a conventional OLED. In addition, it is known that blue light-emitting OLED units are not as stable as white light-emitting units. U.S. Pat. No. 6,903,378 discloses a tandem OLED having two white light-emitting EL units and color filters. However, there is little disclosure about how to optimize these EL units to produce improved performance.

A need exists for displays that are simple to make, but also have effective color gamut and high efficiency.

SUMMARY OF THE INVENTION

It is an object of the present invention to produce a more effective OLED device. This object is achieved by a tandem white light-emitting OLED device comprising:
  a. a spaced anode and cathode;
  b. a light reflector associated with either the anode or the cathode;
  c. a first white light emitting unit having an emission spectrum that includes a first set of at least two emission peaks that are more intense than any other emission peaks that may be present in the emission spectrum of the first white light-emitting unit, such first set including:
  i. a first blue spectral component having a first blue peak emission wavelength of between 440 and 490 nm; and
  ii. a yellow spectral component having a yellow peak emission wavelength of between 550 and 590 nm;
d. a second white light-emitting unit disposed closer to the reflector than the first white light-emitting unit, such second white light-emitting unit having an emission spectrum that includes a second set of at least three emission peaks that are more intense than any other emission peaks that may be present in the emission spectrum of the second white light-emitting unit, such second set including:
  i. a second blue spectral component having a second blue peak emission wavelength of between 440 and 490 nm;
  ii. a green spectral component having a peak emission wavelength of between 500 and 540 nm; and
  iii. a red spectral component having a peak emission wavelength of between 600 and 700 nm; and
e. an intermediate connector disposed between the first and second white light-emitting units.

ADVANTAGES

The present invention provides for an OLED device with improved power efficiency resulting in higher brightness, longer lifetime, or both. In display applications, the OLED device of this invention further improves the color gamut.

Since device feature dimensions such as layer thicknesses are frequently in submicrometer ranges, the drawings are scaled for ease of visualization rather than dimensional accuracy.

DETAILED DESCRIPTION OF THE INVENTION

A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors are produced by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, white light is that light that is perceived by a user as having a white color, or light that has an emission spectrum sufficient to be used in combination with color filters to produce a practical full color display. For low power consumption, it is often advantageous for the chromaticity of the white light-emitting OLED to be close to CIE $D_{65}$, i.e., CIE x=0.31 and CIE y=0.33. This is particularly the case for so-called RGBW displays having red, green, blue, and white pixels. Although CIEx, CIEy coordinates of about 0.31, 0.33 are ideal in some circumstances; the actual coordinates can vary significantly and still be very useful.

Figure 1:
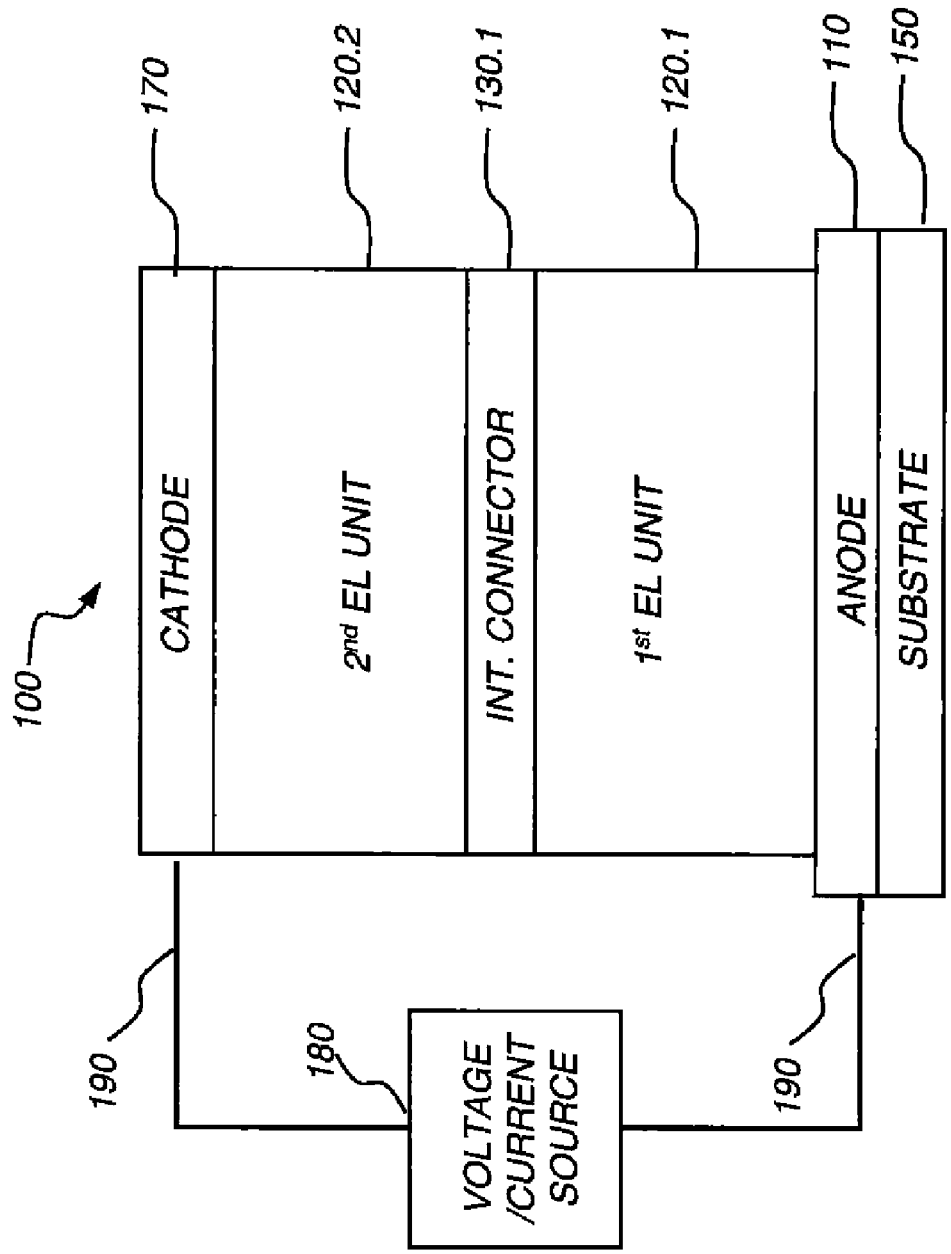
FIG. 1 shows a schematic cross-sectional view of a tandem white OLED device in accordance with the present invention.

Turning now to FIG. 1, there is shown a cross-sectional view of one embodiment of a tandem OLED device 100 for producing white light in accordance with the present invention. This tandem OLED device includes a substrate 150 and at least two spaced electrodes, here an anode 110 and a cathode 170. Disposed between the anode and the cathode are at least two organic white light-emitting (EL) units 120.2 and 120.1. In this embodiment, the cathode is reflective and white EL unit 120.1 is disposed further from reflective cathode than white EL unit 120.2. In an alternative embodiment, the anode can be reflective, and if so, unit 120.1 would be interchanged with the location of 120.2 so that 120.1 was further from the reflective anode. Tandem OLED display 100 also includes an intermediate connector 130.1 disposed between EL units 120.1 and 120.2. If more EL units are provided, an intermediate connector is provided between every adjacent EL unit.

White EL unit 120.2 is provided closer to the reflective electrode than white EL unit 120.1. White EL unit 120.2 has an emission spectrum that includes a set of at least three emission peaks that are more intense than any other emission peaks that may be present in the emission spectrum of 120.2. This set includes a first blue spectral component having a first blue peak emission wavelength of between 440 and 490 nm, a green spectral component having a peak emission wavelength of between 500 and 540 nm, and a red spectral component having a peak emission wavelength of between 600 and 700 nm.

White EL unit 120.1 is provided further from the reflective electrode than white EL unit 120.2. White EL unit 120.1 has an emission spectrum that includes a set of at least two emission peaks that are more intense than any other emission peaks that may be present in the emission spectrum of 120.1. This set includes a blue spectral component having a blue peak emission wavelength of between 440 and 490 nm and yellow spectral component having a yellow peak emission wavelength of between 550 and 590 nm. The blue spectral component of EL unit 120.1 can be the same or different from EL unit 120.2.

The emission spectra of individual EL units 120.1 and 120.2 can be tested by constructing and measuring non-tandem, single EL unit devices having the same or similar materials and layers as used in each of 120.1 and 120.2.

The tandem OLED display 100 is externally connected to a voltage/current source 180 through electrical conductors 190 and is operated by applying an electric potential produced by a voltage/current source between a pair of contact electrodes, i.e. anode 110 and cathode 170. Under a forward the electric potential across the tandem white OLED causes holes (positively charged carriers) to be injected from anode 110 into light-emitting unit 120.1, and electrons (negatively charged carriers) to be injected from cathode 170 into light-emitting unit 120.2. Simultaneously, electrons and holes are produced in, and separated from, the intermediate connectors 130.1. Electrons thus produced in intermediate connector 130.1, are injected towards the anode and into the adjacent white EL unit 120.1. Likewise, holes produced in the intermediate connector 130.1 are injected towards the cathode and into the adjacent white EL unit 120.2. Subsequently, these electrons and holes recombine in their corresponding light-emitting units to produce light. Although only emissive under forward bias, it has been shown in the prior art that driving the OLED using an alternating bias can sometimes improve the lifetime.

In display applications, OLED device 100 is a pixel in an array of pixels typically associated with an array of color filters. The array of color filters receives light from OLED device 100 wherein the band pass of each of the color filters is selected to produce different colored light. The band pass of a color filter is defined as the range of wavelengths wherein the transmittance of light is at least 50% of the maximum transmittance by the filter. Although the array of color filters can have a variety of color filter combinations, a common combination of color filters includes those that produce red, green, and blue light (RGB filters). In RGBW systems, an unfiltered white (W) pixel is included in addition to RGB filters. Alternatively, the W pixel can include a trimming filter to produce white light of a particular hue in the event that the hue of white OLED device 100 does not emit that particular hue. In a display comprising multiple pixels, the space between the individual color filter elements can also be filled with a black matrix to improve the display's contrast.

Each white EL unit in the tandem OLED display 100 is capable of supporting hole transport, electron transport, and electron hole recombination to produce light. Typically, each EL unit can include a plurality of layers. There are many organic light-emitting multilayer structures known in the art that are used as the white EL unit of the present invention. These include, but are not limited to, a hole-transporting layer (HTL)/one or more light-emitting layers (LEL or LELs)/electron-transporting layer (ETL), hole-injecting layer (HIL)/HTL/(LEL or LELs)/ETL, HIL/HTL/(LEL or LELs)/ETL/electron-injecting layer (EIL), HIL/HTL/electron-blocking layer/(LEL or LELs)/ETL/EIL, and HIL/HTL/(LEL or LELs)/hole-blocking layer/ETL/EIL. It is particularly useful if the EL unit adjacent to the anode includes an HIL in contact with the anode and if the EL unit adjacent to the cathode includes an EIL in contact with the cathode.

Although the blue, green, and red spectral components of EL unit 120.2 can be produced by a single LEL incorporating blue, green, and red emitting dopants, this requires extremely careful control of dopant concentration because of the tendency for all of the excitons to combine on the lowest energy dopant (red). More robust designs use separate layers for different spectral components. Thus, it is often preferred that the blue, green, and red spectral components of EL unit 120.2 be produced by separate emission layers. Similarly, the blue and yellow spectral components of EL unit 120.1 can be produced by a single LEL incorporating blue and yellow emitting dopants, but more robust designs use separate layers for different spectral components. Thus, it is often preferred that the blue and yellow spectral components of EL unit 120.1 be produced by separate emission layers.

In order to reduce drive voltage for the tandem OLED display, it is often desirable to make each light-emitting unit as thin as possible without compromising the electroluminescence efficiency. It is preferable that each light-emitting unit is less than 500 nm thick, and more preferable that it be 2-250 nm thick. It is also preferable that each layer within the light-emitting unit be 200 nm thick or less, and more preferable that it be 0.1-100 nm. It is also preferable that the thickness of each LEL in the light-emitting unit be in the range of from 5 nm to 50 nm.

Figure 2:
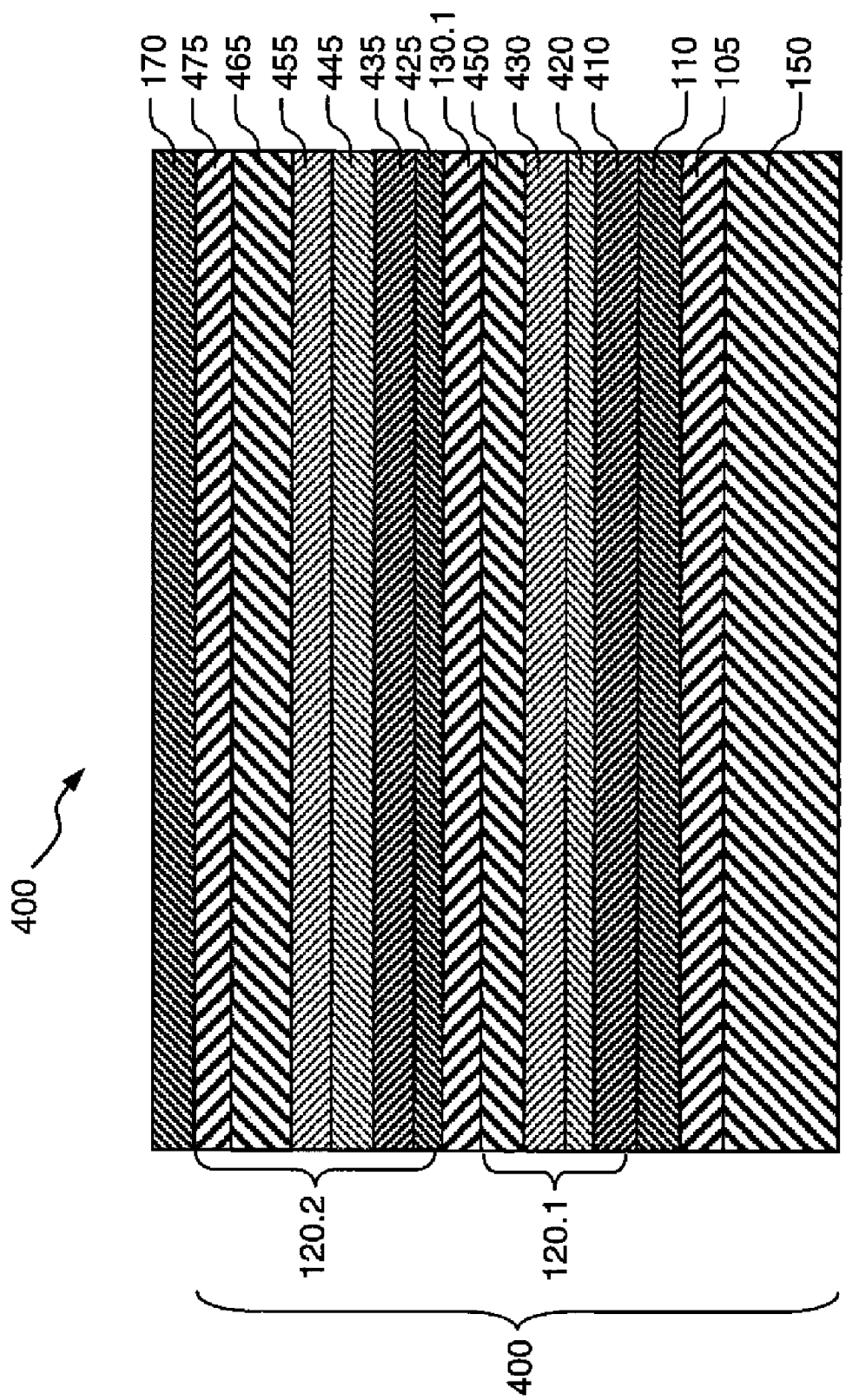
FIG. 2 shows a schematic cross-sectional view of a preferred embodiment of a tandem white OLED device in accordance with the present invention.

Turning now to FIG. 2, there is shown a more detailed cross-sectional view of a white light-emitting tandem OLED device 400 in order to illustrate one preferred embodiment of the present invention. As mentioned above, many other layer structure options can be used. Like tandem OLED device 100, tandem OLED device 400 includes a substrate 150, an anode 110, a reflective cathode 170 spaced from anode 110, a first white EL unit 120.1, a intermediate connector 130.1, and a second white EL 120.2. In OLED device 400, the substrate 150 and anode 110 are light transmissive and a color filter 105 is provided between the anode and substrate. White EL unit 120.1 includes HIL 410 adjacent to the anode, HTL 420, yellow light-emitting layer 430 and blue light-emitting layer 450. White EL unit 120.2 includes HTL 425, red light-emitting layer 435, green light-emitting layer 445, blue light-emitting layer 455, ETL 465, and EIL 475 adjacent to a reflective cathode. Useful materials for these layers are described below.

The HTL contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. In U.S. Pat. No. 3,180,730, Klupfel et al. illustrate exemplary monomeric triarylamines. In U.S. Pat. Nos. 3,567,450 and 3,658,520, Brantley et al. disclose other suitable triarylamines substituted with one or more vinyl radicals or at least one active hydrogen-containing group.

A more preferred class of aromatic tertiary amines are those which include at least two aromatic tertiary amine moieties as described by VanSlyke et al. in U.S. Pat. Nos. 4,720,432 and 5,061,569. The HTL is formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;

4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]
  amino}biphenyl;
2,6-Bis[N,N-di(2-naphthyl)amino]fluorene;
4,4',4"-tris[(3-methylphenyl)phenylamino]triphenylamine
  (MTDATA); and
4,4'-Bis[N-(3-methylphenyl)-N-phenylamino]biphenyl
  (TPD).

Another class of useful hole-transporting materials includes polycyclic aromatic compounds as described in EP 1 009 041. Tertiary aromatic amines with more than two amino groups are used including oligomeric materials. In addition, polymeric hole-transporting materials are used such as poly (N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The LEL includes a luminescent fluorescent or phosphorescent material where electroluminescence is produced as a result of electron-hole pair recombination in this region. The light-emitting layer includes a single material, but more commonly contains a host material doped with a guest emitting material or materials where light emission comes primarily from the emitting materials and is of any color. This guest emitting material is often referred to as a light-emitting dopant. The host materials in the light-emitting layer are an electron-transporting material, as defined below, a hole-transporting material, as defined above, or another material or combination of materials that support hole-electron recombination. The emitting material is typically chosen from highly fluorescent dyes and phosphorescent compounds, e.g. transition metal complexes as described in WO 98/55561, WO 00/18851, WO 00/57676, and WO 00/70655. Emitting materials are typically incorporated at 0.01 to 10% by weight of the host material.

The host and emitting materials are small nonpolymeric molecules or polymeric materials including polyfluorenes and polyvinylarylenes, e.g., poly(p-phenylenevinylene), PPV. In the case of polymers, small molecule emitting materials are molecularly dispersed into a polymeric host, or the emitting materials are added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)];

CO-2: Magnesium bisoxine [alias, bis(8-quinolinolato) magnesium(II)];

CO-3: Bis[benzo{f}-8-quinolinolato]zinc (II);

CO-4: Bis(2-methyl-8-quinolinolato)aluminum(III)-m-oxo-bis(2-methyl-8-quinolinolato)aluminum(III);

CO-5: Indium trisoxine [alias, tris(8-quinolinolato)indium];

CO-6: Aluminum tris(5-methyloxine) [alias, tris(5-methyl-8-quinolinolato)aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Another class of useful host materials includes derivatives of anthracene, such as those described in U.S. Pat. Nos. 5,935,721, 5,972,247, 6,465,115, 6,534,199, 6,713,192, U.S. Patent Application Publications 2002/0048687 A1, 2003/0072966 A1, and WO 2004/018587 A1. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts. Mixtures of anthracene derivatives with arylamine derivatives are particularly useful hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrilium compounds, fluorene derivatives, periflanthene derivatives, indenoperylene derivatives, bis(azinyl)amine boron compounds, bis (azinyl)methane boron compounds, derivatives of distyrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton is transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2; WO 01/39234 A2; WO 01/93642 A1; WO 02/074015 A2; WO 02/15645 A1; and U.S. Patent Application Publication 2002/0117662 A1. Suitable hosts include certain aryl amines, triazoles, indoles, and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Examples of useful phosphorescent materials that are used in light-emitting layers of the present invention include, but are not limited to, those described in WO 00/57676 A1, WO 00/70655 A1, WO 01/41512 A1, WO 02/15645 A1, WO 01/93642 A1, WO 01/39234 A2, WO 02/074015 A2, WO 02/071813 A1, U.S. Pat. Nos. 6,458,475, 6,573,651, 6,451,455, 6,413,656, 6,515,298, 6,451,415, 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, EP 1 244 155 A2, JP 2003073387A, JP 2003073388A, JP 2003059667A, and JP 2003073665A. Useful phosphorescent dopants include, but are not limited to, transition metal complexes, such as iridium and platinum complexes.

In the present invention, at least two EL units emit white light. Multiple dopants are added to one or more layers in order to produce a white-emitting OLED, for example, by combining blue- and yellow-emitting materials or red-, green-, and blue-emitting materials. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, and 2004/0009367 A1. In preferred embodiments, white light is produced by multiple LELs. In some of these systems, the host for one light-emitting layer is a hole-transporting material.

At least one red-light-emitting compound in the present invention should have a peak spectral component between 600 nm and 700 nm, preferably between 600 and 640 nm. The red-light-emitting compound can include a diindenoperylene compound of the following structure:

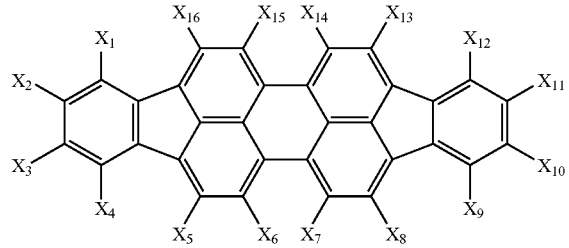

A1 wherein:

$X_1$-$X_{16}$ are independently selected as hydrogen or substituents that include alkyl groups of from 1 to 24 carbon atoms;

aryl or substituted aryl groups of from 5 to 20 carbon atoms;

hydrocarbon groups containing 4 to 24 carbon atoms that complete one or more fused aromatic rings or ring systems, or halogen; provided that the substituents provide a red spectral component having a peak emission between 600 and 700 nm.

Illustrative examples of useful red dopants of this class include the following:

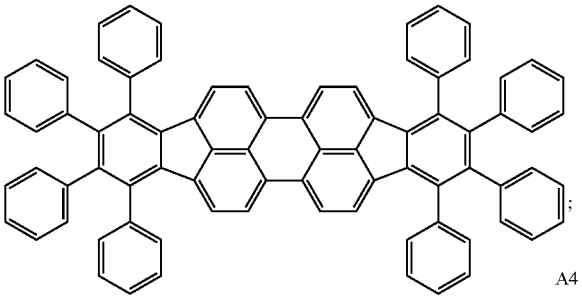

A3

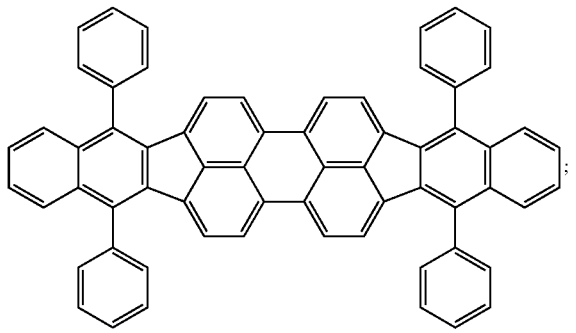

TPDBP, or

A4

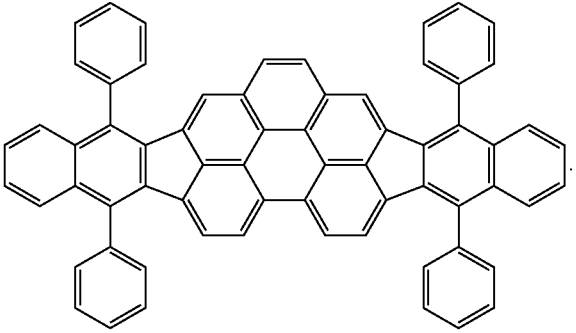

A5

A particularly preferred diindenoperylene dopant is TPDBP (A4 above). Other red dopants useful in the present invention include cyano substituted distyrlarylene derivatives, e.g., as described in U.S. Pat. No. 6,228,514 and U.S. Pat. No. 6,555,254. The red dopant can also be a mixture of compounds that would also be red dopants individually.

At least one orange or yellow light-emitting compound should be used in the present and have a peak spectral component between 550 and 590 nm. Some useful compounds include the following structures:

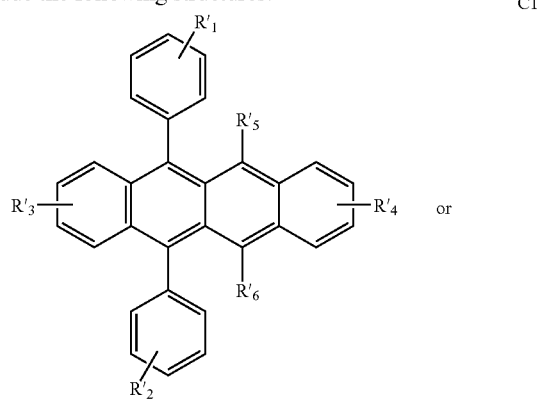

C1 or

-continued

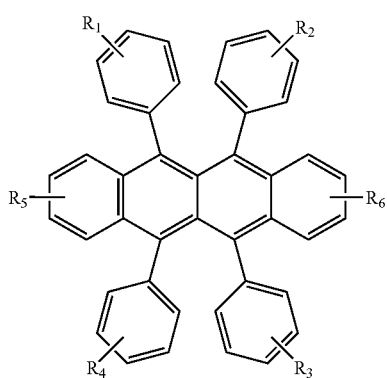

C2 wherein R₁-R₆ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful dopants of this class are shown below:

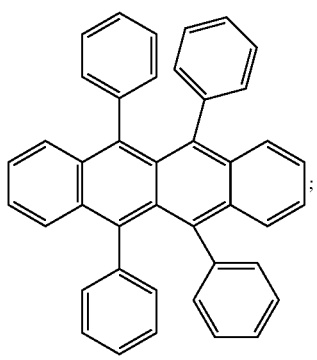

(Rubrene, C3)

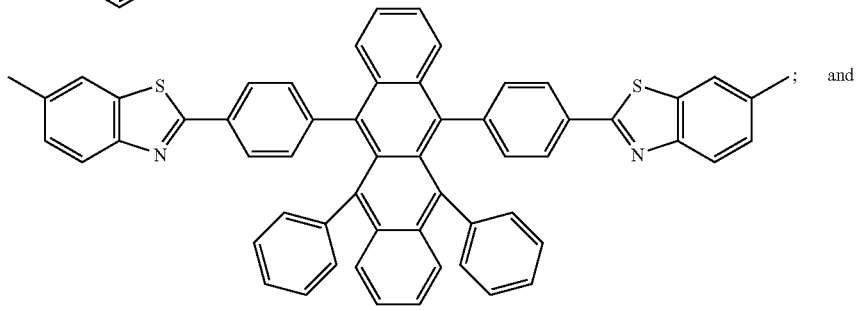

(DBzR, C4) and

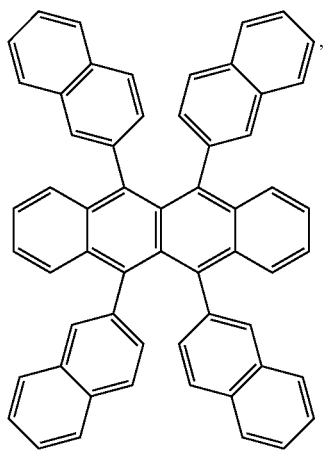

(NR, C5)

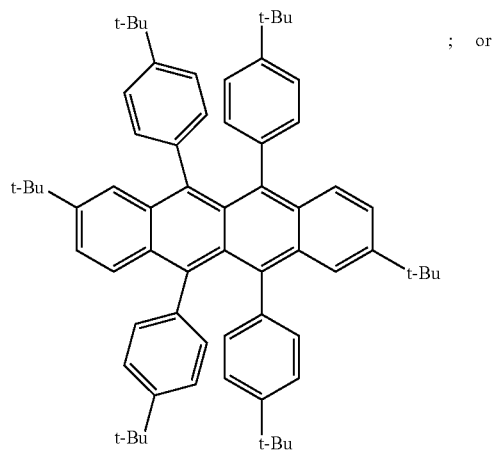

C6 ; or

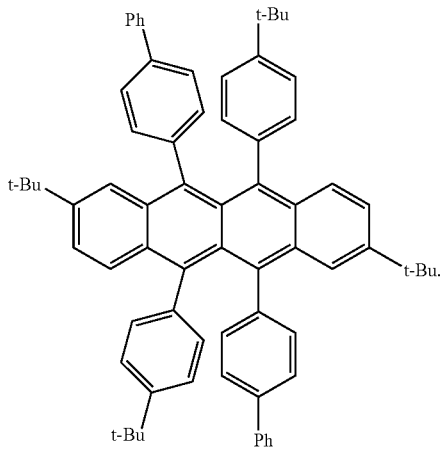

Useful green-light-emitting compounds have a peak spectral component between 500 and 540 nm. The green-light-emitting compound can include a quinacridone compound of the following structure:

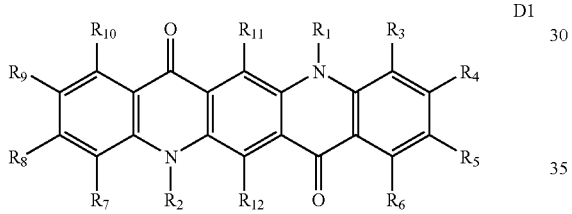

D1 wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, provided that the substituents are selected to provide an emission maximum between 500 nm and 540 nm. Alkyl, alkoxyl, aryl, heteroaryl, fused aromatic ring and fused heteroaromatic ring substituent groups are further substituted. Conveniently, $R_1$ and $R_2$ are aryl, and $R_2$ through $R_{12}$ are hydrogen, or substituent groups that are more electron withdrawing than methyl. Some examples of useful quinacridones include those disclosed in U.S. Pat. No. 5,593,788 and in U.S. Patent Application Publication 2004/0001969 A1.

Examples of useful quinacridone green dopants include:

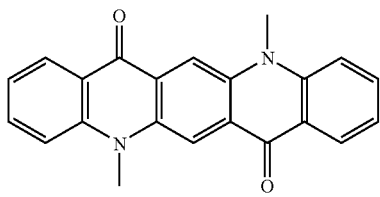

D2

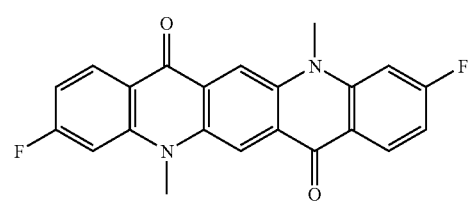

D3

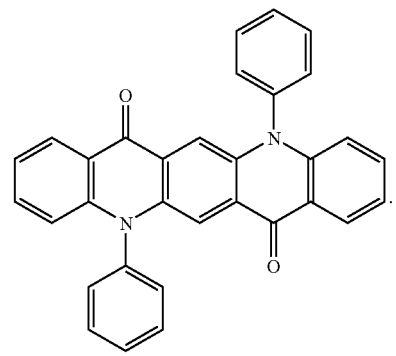

D4

The green-light-emitting compound can include a coumarin compound of the following structure:

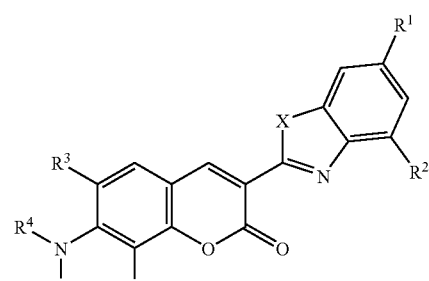

E1 wherein:

X is O or S, $R^1$, $R^2$, $R^3$ and $R^6$ can individually be hydrogen, alkyl, or aryl;

$R^4$ and $R^5$ can individually be alkyl or aryl, or where either $R^3$ and $R^4$, or $R^5$ and $R^6$, or both together represent the atoms completing a cycloalkyl group, provided that the substituents are selected to provide an emission maximum between 500 nm and 540 nm.

Examples of useful coumarin green dopants include:

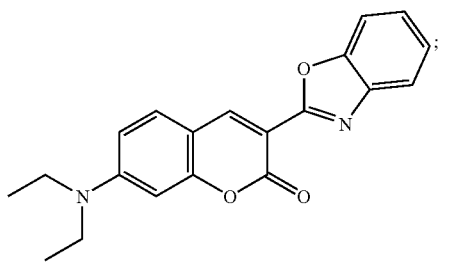

E2

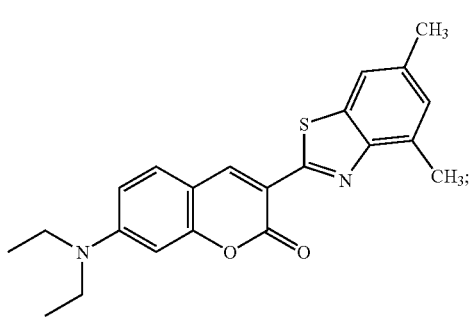

E3

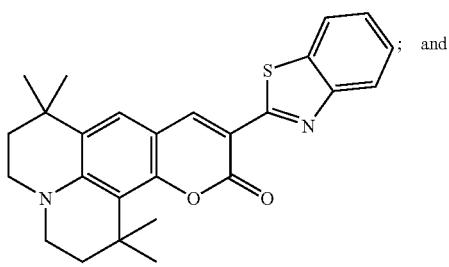

E4; and

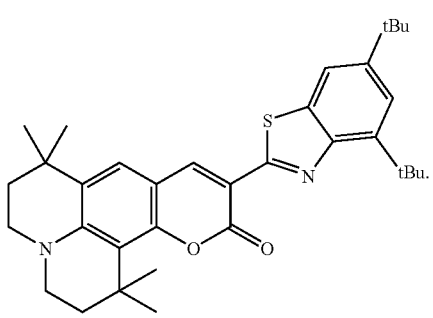

E5

Blue-light-emitting compound have a peak spectral component between 440 nm and 490 nm (depending on the blue filter). The blue-light-emitting compound can include a bis(azinyl)azene boron complex compound of the structure F1:

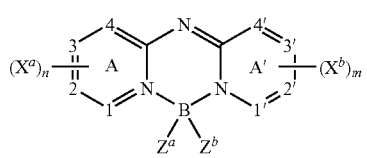

F1 wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide an emission maximum between 440 nm and 490 nm.

Some examples of the above class of dopants include the following:

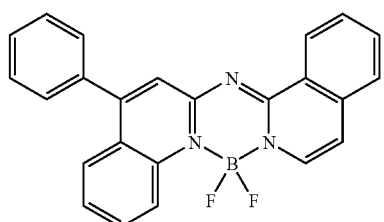

F2; or

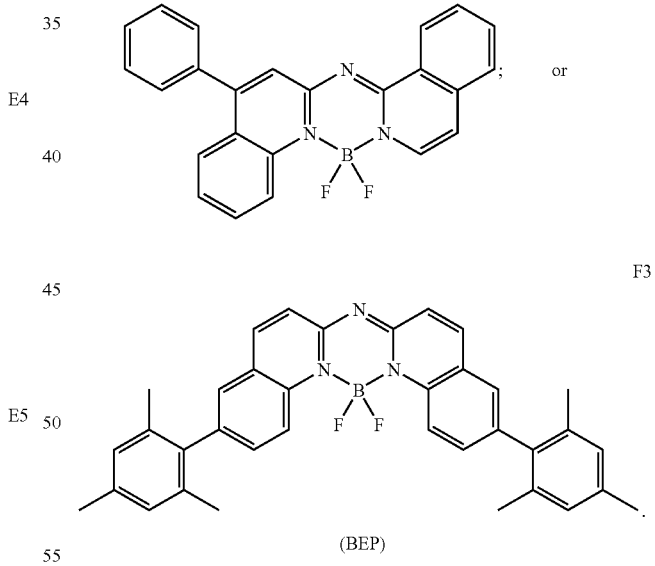

F3

(BEP)

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure shown below:

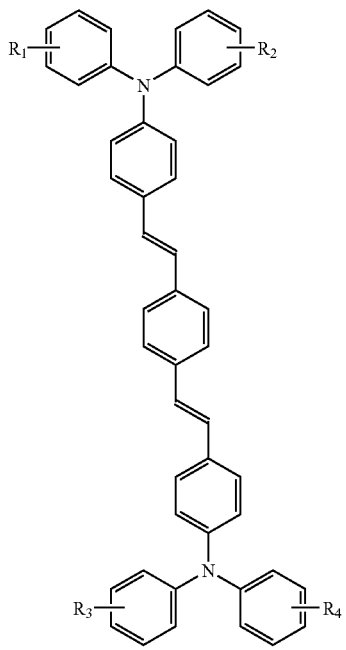

and bis[2-[4-[N,N-diarylamino]phenyl]vinyl]biphenyls of the general structure shown below:

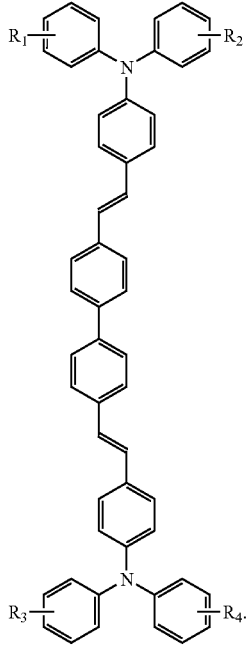

In Formulas G1 and G2, $R_1$-$R_4$ are the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl) amino]phenyl]vinyl]benzene (BDTAPVB, Formula G3 below).

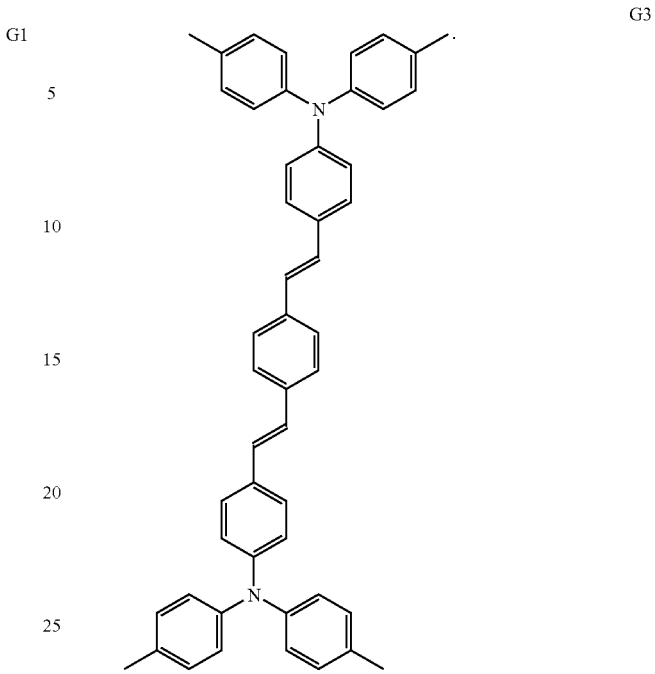

Another particularly useful class of blue dopants includes perylene or derivatives of perylene, such as H2 shown below.

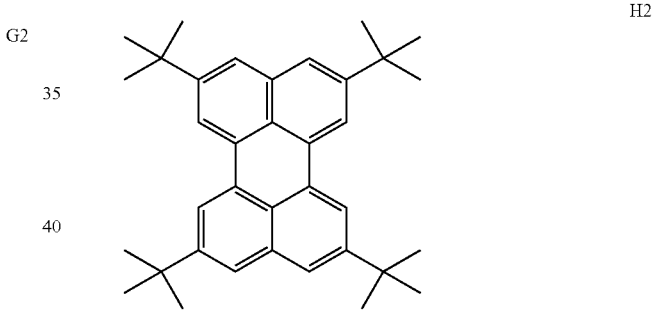

The host material in one or more of the light-emitting layers of the present invention is an anthracene derivative having hydrocarbon or substituted hydrocarbon substituents at the 9 and 10 positions. For example, derivatives of 9,10-di-(2-naphthyl)anthracene (Formula J1) constitute one class of useful host materials capable of supporting electroluminescence, and are particularly suitable for light emission of wavelengths longer than 400 nm, e.g., blue, green, yellow, orange or red

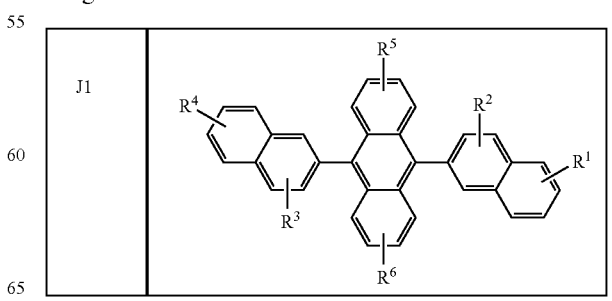

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

The monoanthracene derivative of Formula (J2) is also a useful host material capable of supporting electroluminescence, and are particularly suitable for light emission of wavelengths longer than 400 nm, e.g., blue, green, yellow, orange or red. Anthracene derivatives of Formula (J2) are described in commonly assigned U.S. patent application Ser. No. 10/950,614 filed Sep. 27, 2004 by Lelia Cosimbescu et al., entitled "Electroluminescent Device With Anthracene Derivative Host", the disclosure of which is herein incorporated by reference,

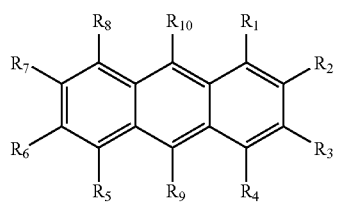
(J2)

wherein:

$R_1$-$R_8$ are H;

$R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula:

A1-L-A2 (J3)

wherein A 1 and A 2 each represent a substituted or unsubstituted monophenylanthryl group or a substituted or unsubstituted diphenylanthryl group and are the same with or different from each other and L represents a single bond or a divalent linking group.

Another useful class of anthracene derivatives is represented by general formula:

A3-An-A4 (J4)

wherein:

An represents a substituted or unsubstituted divalent anthracene residue group; and A 3 and A 4 each represent a substituted or unsubstituted monovalent condensed aromatic ring group or a substituted or unsubstituted noncondensed ring aryl group having 6 or more carbon atoms and are the same with or different from each other. Specific examples of useful anthracene materials for use in a light-emitting layer include:

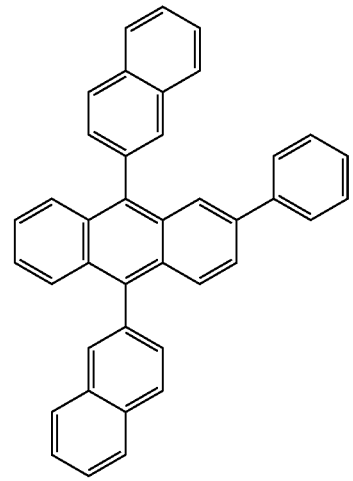
AH1

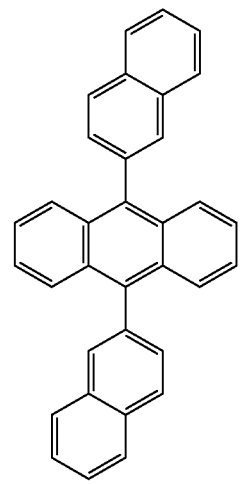
AH2

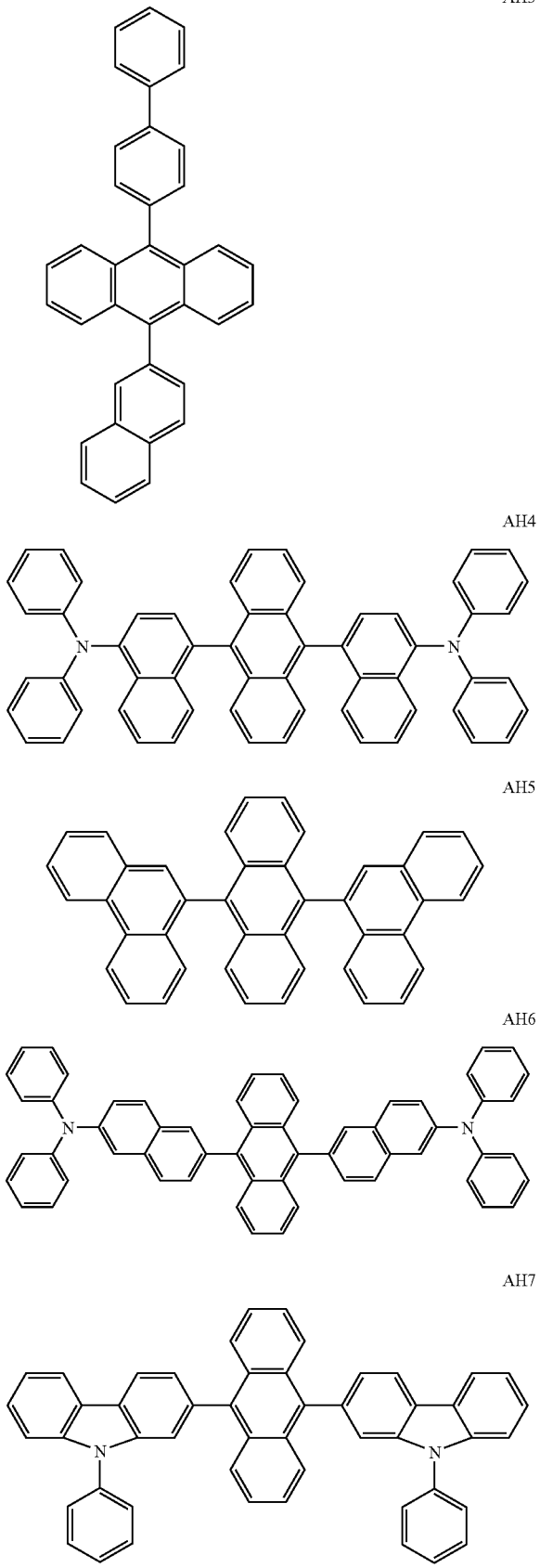

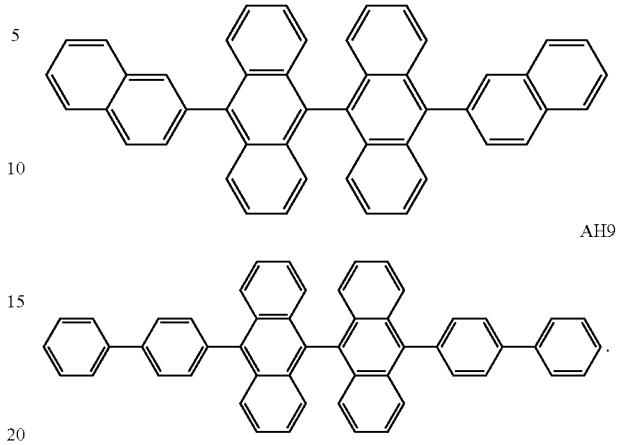

The ETL can contain one or more metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9.

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

For a tandem OLED to function efficiently, it is preferable that an intermediate connector be provided between organic EL units. The intermediate connector provides effective carrier injection into the adjacent EL units. Metals, metal compounds, or other inorganic compounds are effective for carrier injection. However, such materials often have low resistivity, which can result in pixel crosstalk. Also, the optical transparency of the layers constituting the intermediate connector should be as high as possible to permit for radiation produced in the EL units to exit the device. Therefore, it is often preferred to use mainly organic materials in the intermediate connector. There are several useful configurations for the intermediate connector. Some nonlimiting examples of intermediate connectors are described in U.S. Pat. Nos. 6,717,358 and 6,872,472, and U.S. Patent Application Publication 2004/0227460 A1.

Preferably, intermediate connector includes an n-type doped organic layer or a p-type doped organic layer or both. One useful intermediate connector has two layers including an n-type doped organic layer and an electron-accepting layer. The electron-accepting layer is disposed closer to the cathode than the n-type doped organic layer. These two layers are in contact, or an interfacial layer can separate them. The intermediate connector can include a p-type doped organic layer disposed over the electron-accepting layer. The p-type doped organic layer is closer to the cathode than the electron-accepting layer. In this configuration, the p-type doped organic layer is preferably in contact with the electron-accepting layer. The intermediate connector can have both an interfacial layer and a p-type doped organic layer. Alternatively, the intermediate connector can include: an n-type doped organic layer adjacent to a p-type doped organic layer; an n-type doped organic layer and an interfacial layer; an n-type doped organic layer, an interfacial layer, and an p-type doped organic layer.

The n-type doped organic layer contains at least one electron-transporting material as a host material and at least one n-type dopant. The term "n-type doped organic layer" means that this layer has semiconducting properties after doping, and the electrical current through this layer is substantially carried by the electrons. The host material is capable of supporting electron injection and electron transport. The electron-transporting materials defined previously for use in the ETL represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by VanSlyke et al. in U.S. Pat. No. 4,539,507, triazines, hydroxyquinoline derivatives, benzazole derivatives, and phenanthroline derivatives. Silole derivatives, such as 2,5-bis(2',2''-bipridin-6-yl)-1,1-dimethyl-3,4-diphenyl silacyclopentadiene are also useful host organic materials. In some instances it is useful to combine two or more hosts to obtain the proper charge injection and stability properties. More specific examples of useful host materials in the n-type organic doped layer include Alq, 4,7-diphenyl-1,10-phenanthroline (Bphen), or 2,9-dimethyl-4,7-diphenyl-1,10-phenanthroline (BCP), or combinations thereof.

The n-type dopant in the n-type doped organic layer includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped organic layer also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped organic layer includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume. The thickness of the n-type doped organic layer is typically less than 200 nm, and preferably less than 100 nm.

The electron-accepting layer (if used) of the intermediate connector includes one or more organic materials, each having an electron-accepting property and a reduction potential greater than –0.5 V vs. a Saturated Calomel Electrode (SCE), and wherein the one or more organic materials provide more than 50% by volume in the intermediate connector. Preferably, the electron-accepting layer includes one or more organic materials having a reduction potential greater than –0.1 V vs. SCE. More preferably, the electron-accepting layer includes a single organic material having an electron-accepting property and a reduction potential greater than –0.1 V vs. SCE. By "electron-accepting property" it is meant that the organic material has the capability or tendency to accept at least some electronic charge from other type of material that it is adjacent.

The electron-accepting layer, including one or more organic materials having a reduction potential greater than –0.5 V vs. SCE and providing more than 50% by volume in the electron-accepting layer, can have both effective carrier injection and effective optical transparency in the tandem OLED. Organic materials suitable for use in the electron-accepting layer include not only simple compounds containing at least carbon and hydrogen, but also include metal complexes, e.g., transition metal complexes having organic ligands and organometallic compounds, as long as their reduction potentials are more positive than –0.5 V vs. SCE. Organic materials for the electron-accepting layer can include small molecules (capable of being deposited by vapor deposition), polymers, or dendrimers, or combinations thereof. Electron accepting layers are most effective when at least a portion of the electron-accepting layer does not significantly mix with adjacent layers. This is accomplished by choosing materials having molecular weight high enough to prevent such diffusion. Preferably, the molecular weight of the electron-accepting material is greater than 350. To maintain the proper electron-accepting properties of the layer, it is desirable that the one or more organic materials constitute more than 90% by volume of the electron-accepting layer. For manufacturing simplicity, a single compound is used for the electron-accepting layer.

Some examples of organic materials having a reduction potential greater than –0.5 V vs. SCE that are used to form the electron-injecting layer include, but are not limited to, derivatives of hexaazatriphenylene and tetracyanoquinodimethane. A useful thickness of the electron-accepting layer is typically between 3 and 100 nm.

The term "p-type doped organic layer" means that the organic layer has semiconducting properties after doping, and the electrical current through this layer is substantially carried by the holes. When used in the present invention, the optional p-type doped organic layer contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. In U.S. Pat. Nos. 3,567,450 and 3,658,520, Brantley et al. disclose other suitable triarylamines substituted with one more vinyl radicals or comprising at least one active hydrogen-containing group. A more preferred class of aromatic tertiary amines are those which include at least two aromatic tertiary amine moieties as described by VanSlyke et al. in U.S. Pat. Nos. 4,720,432 and 5,061,569. Nonlimiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). Another preferred class of aromatic amines are dihydrophenazine compounds as described in commonly assigned U.S. patent application Ser. No. 10/390,973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer includes NPB, TPD, TNB, 4,4',4"-tris(N-3-metylphenyl-N-phenyl-amino)-triphenylamine (m-MTDATA), 4,4',4"-tris(N,N-diphenyl-amino)-triphenylamine (TDATA), or dihydrophenazine compounds, or combinations thereof.

The p-type dopant in the p-type doped organic layer includes oxidizing agents with strong electron-withdrawing properties. "Strong electron-withdrawing properties" means that the organic dopant should be able to accept some electronic charge from the host to form a charge-transfer complex with the host material. Some nonlimiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can include small molecule materials or polymeric materials, or combinations thereof. In some instances, the same host material is used for both n-type and p-type doped organic layers, provided that it exhibits both hole and electron transport properties set forth above. Examples of materials that are used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl (CBP), and distyrylarylene derivatives such as 4,4'-bis(2, 2'-diphenyl vinyl)-1,1'-biphenyl, and as described in U.S. Pat. No. 5,121,029.

A p-type doped organic layer can form at the interface of the electron-accepting layer and the HTL simply by deposition of the HTL material. In the present invention, the materials chosen for the electron-accepting layer and the HTL are such that only a small amount of mixing occurs. That is, it is important that at least some of the electron-accepting layer does not mix with the HTL material.

When used in the present invention, the optional interfacial layer in the intermediate connector is mainly used to stop the possible inter-diffusion between materials of the various layers within the intermediate connector. The interfacial layer is a metal compound or a metal. When used, the layer should be as thin as possible to be effective, reduce optical losses, and prevent unwanted pixel crosstalk if the interfacial layer is conductive or semiconductive.

The interfacial layer can contain a metal compound selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The interfacial layer can contain a metal compound selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The interfacial layer 332 can contain a metal compound selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. Particularly useful metal compounds for use in the interfacial layer are selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound is selected from $MoO_3$, $NiMoO_4$, $CuMoO_4$, or $WO_3$.

When using a metal compound, the thickness of the interfacial layer in the intermediate connector is in the range of from 0.5 nm to 20 nm.

Alternatively, the interfacial layer can include a high work function metal layer. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer includes Ag, Al, Cu, Au, Zn, In, or Sn, or combinations thereof. More preferably, the high work function metal includes Ag or Al.

When using a high work function metal, the thickness of the interfacial layer in the intermediate connector is in the range of from 0.1 nm to 5 nm.

The overall thickness of the intermediate connectors is typically from 5 nm to 200 nm. If there are more than two intermediate connectors in a tandem OLED, the intermediate connectors are the same or different from each other in terms of layer thickness, material selection, or both.

Each of the layers in the EL unit is formed from small molecule OLED materials, or polymeric LED materials, or combinations thereof. Some EL units can be polymeric and other units can be small molecules (or nonpolymeric), including fluorescent materials and phosphorescent materials.

As mentioned previously, it is often useful to provide a hole-injecting layer (HIL) between the anode and the HTL. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208, 075, and 6,208,077, some aromatic amines, for example, m-MTDATA (4,4',4"-tris[(3-methylphenyl)phenyl-amino] triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. p-Type doped organic materials as described previously for use in the intermediate connector are also a useful class of hole-injecting materials. Hexaazatriphenylene derivatives are also useful HIL materials, as described in U.S. Pat. No. 6,720,573. A particularly useful HIL material is shown below

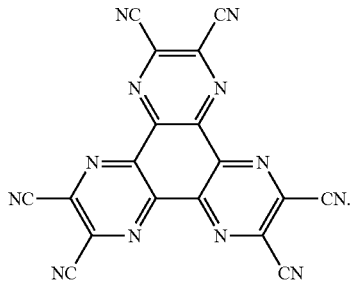

Formula M1

It is often useful to provide an electron-injecting layer (EIL) between the cathode and the ETL. n-Type doped organic layers as described previously for use in the intermediate connector are a useful class of electron-injecting materials.

The OLED of the present invention is typically provided over a supporting substrate 150 where either the cathode or anode is in contact with the substrate. In the present invention, one electrode is substantially reflective and the other is substantially transmissive. A substantially reflective electrode reflects at least 30% of incident light and preferably at least 50%. A substantially transmissive electrode transmits at least 30% of incident light and preferably at least 50%. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore is light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode. A reflective layer can be used behind a transparent electrode material to make a reflective electrode.

When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the anode should be reflective. Examples of reflective conductors for the present invention include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes are patterned using well-known photolithographic processes. Optionally, anodes are polished prior to the deposition of other layers to reduce surface roughness so as to reduce electrical shorts or enhance reflectivity. When light emission is viewed solely through the anode, the cathode used in the present invention includes nearly any conductive material so long as it is reflective. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes an MgAg alloy wherein the percentage of silver is in the range of 1 to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Thermal evaporation, electron beam evaporation, ion sputtering, or chemical vapor deposition are typically used to deposit cathode materials. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

The organic materials mentioned above are suitably deposited through a vapor-phase method such as sublimation, but are deposited from a fluid, for example, from a solvent with an optional binder to improve film formation. If the material is a polymer, solvent deposition is useful but other methods are used, such as sputtering or thermal transfer from a donor sheet. The material to be deposited by sublimation is vaporized from a sublimation "boat" often includes a tantalum material, e.g., as described in U.S. Pat. No. 6,237,529, or is first coated onto a donor sheet and then sublimed in closer proximity to the substrate. Layers with a mixture of materials can use separate sublimation boats or the materials are premixed and coated from a single boat or donor sheet. Patterned deposition is achieved using shadow masks, integral shadow masks (U.S. Pat. No. 5,294,870), spatially defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover is attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

White emission can be combined with color filters to provide a full color or multicolor display. The color filters can include red, green, and blue filters. The present invention is suitably used in displays having four differently colored pixels, for example, red, green, blue, and white emitting pixels (RGBW) as described in U.S. Patent Application Publication 2004/0113875 A1. When the white emitting pixel is substantially not filtered, although it can have some small amount of filtering to trim the color or incidental filtering that might occur due to encapsulation layers or the like provided over the white pixel.

The present invention is employed in most OLED device applications. These include very simple structures comprising a single anode and cathode to more complex devices, such as area color displays, passive matrix displays including orthogonal arrays of anodes and cathodes to form pixels, and active matrix displays where each pixel is controlled independently, for example, with thin film transistors (TFTs). The present invention can also be employed for devices where the OLED is used as a light source, for example, in backlights for LCD displays.

Figure 6:
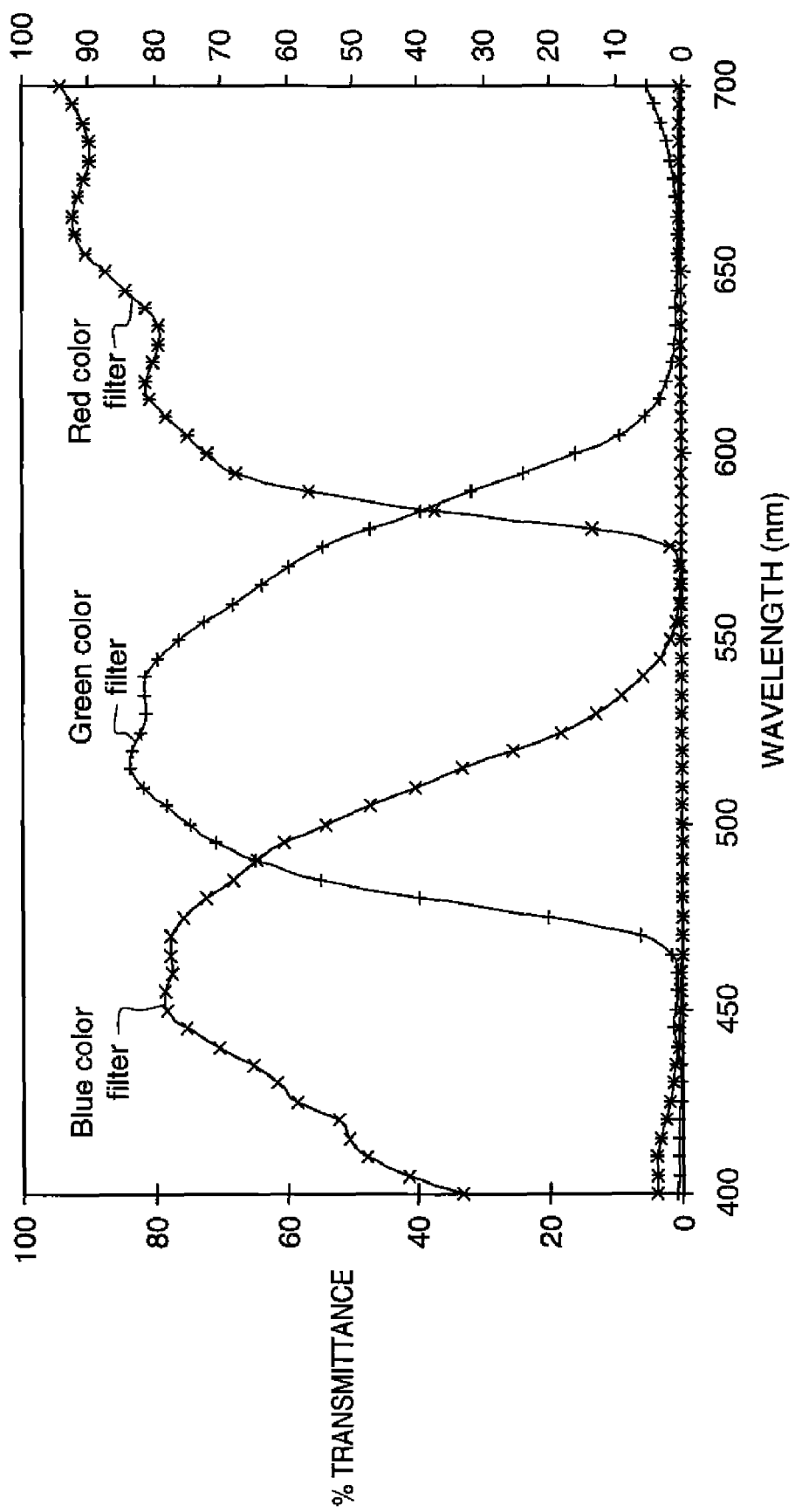
FIG. 6 shows the transmittance spectra of commercially available red, green, and blue color filters.

Regarding useful color filters, FIG. 6 shows the transmittance of commercially available red, green, and blue color filters. The blue color filter has maximum transmission of 80% and full width at half maximum (FWHM) 110 nm between 400-510 nm. The green color filter has maximum transmission of 85% and full width at half maximum (FWHM) 110 nm between 480-580 nm. Similarly, the red color filter has maximum transmission of 91% and full width at half maximum (FWHM) of greater than 110 nm between 590-700 nm. Color filters with different transmittance and bandwidth can also be used.

EXAMPLES

The present invention and its advantages are better appreciated by the following inventive and comparative examples. In the following, mixed compositions are described in terms of percentages by volume, as are commonly used in the art. After deposition of the OLED layers each device was then transferred to a dry box for encapsulation. The OLED has an emission area of 10 mm$^2$. A current of 20 mA/cm2 was applied across electrodes tested the devices. The color gamut for each device was calculated relative to the aim NTSC red, green, and blue color coordinates as measured in CIEx,y space.

Aim NTSC CIE Coordinates

Red CIEx=0.67 CIEy=0.33
Green CIEx=0.21 CIEy=0.71
Blue CIEx=0.14 CIEy=0.08

Example 1-2

(Comparative) Single White EL Units

It is useful to begin with comparative OLEDs having only a single white EL unit. This makes the performance of tandem OLEDs having multiple EL units easier to understand.

Example 1

Comparative

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately $10^{-6}$ Torr:

a) a 240 nm thick HTL of NPB;

b) a 28 nm yellow light-emitting layer including 77% NPB (as host) with 3% yellow-orange emitting dopant as shown in Formula C7 and 20% anthracene derivative of formula AH3 as a stabilizer;

c) a 47 nm blue light-emitting layer including 92% AH3 host with 1% BEP (Formula F3) as blue-emitting dopant and 7% NPB;

d) a 10 nm thick ETL including ALQ; and e) a cathode including 0.5 nm of LiF over the ETL to aid electron injection and 100 nm aluminum evaporated over the LiF.

Figure 3:
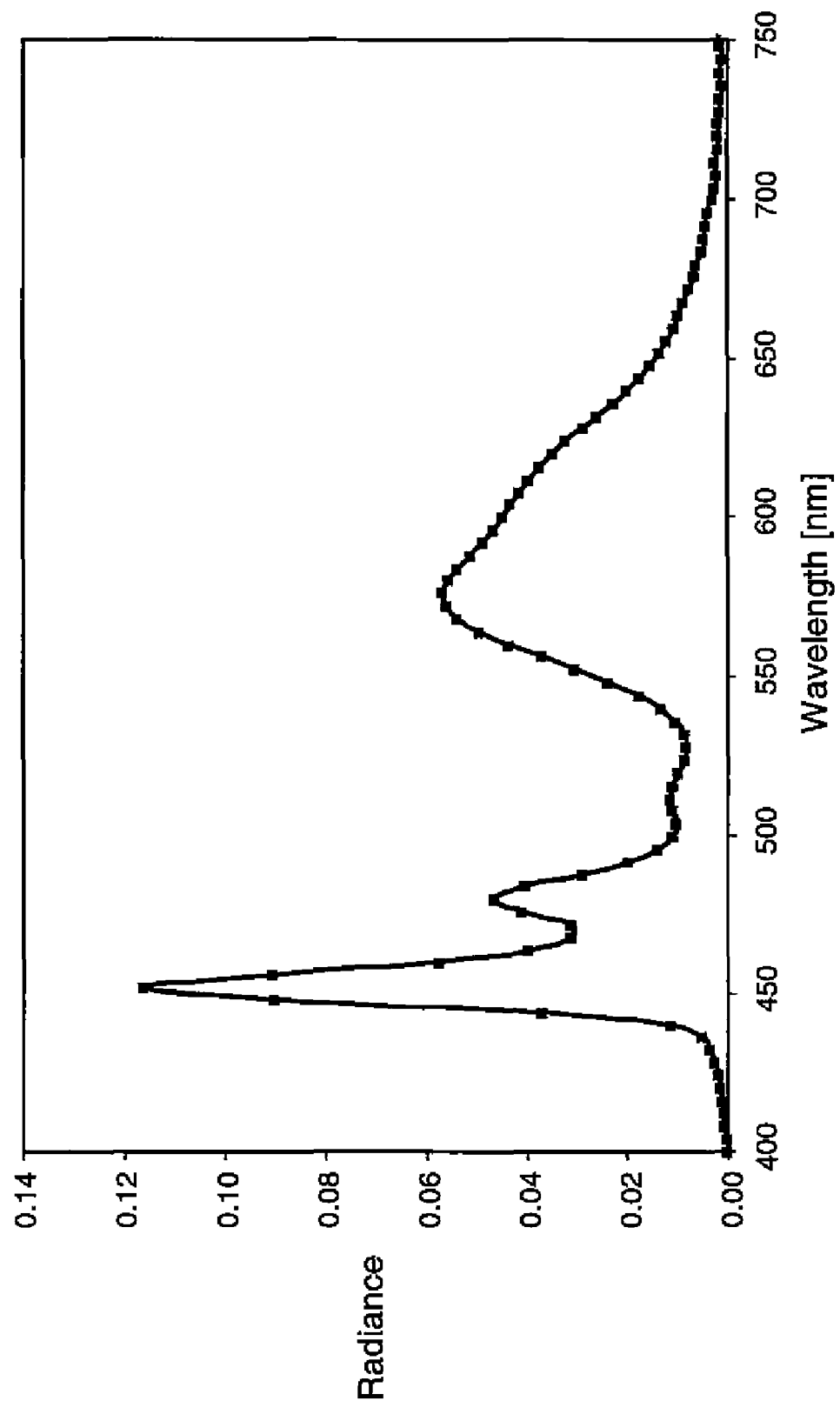
FIG. 3 shows the electroluminescence spectrum of a previously disclosed white OLED device having yellow and blue emitting layers.

The emission spectrum for the device of Example 1 is shown in FIG. 3. This device had a luminance efficiency of 11.7 cd/A, but only 52% NTSC color gamut as calculated using the filters of FIG. 6.

Example 2

Comparative

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately $10^{-6}$ Torr:

a) a 240 nm HTL of NPB;

b) a red-orange light-emitting layer including 59.5% NPB (as host) with 40% Rubrene and 0.5% red emitting dopant (as shown in Formula A4);

c) a 20 nm blue light-emitting layer including 92% AH3 blue host with 1% BEP (Formula F3) as blue emitting dopant and 7% NPB;

d) a 15 nm green light-emitting layer including 49.75% AH3, 49.75% ALQ and 0.5% Formula D4 as green emitting dopant;

e) a 10 nm ETL ALQ; and f) a cathode including 0.5 nm of LiF over the ETL to aid electron injection and 100 nm aluminum evaporated over the LiF.

Figure 4:
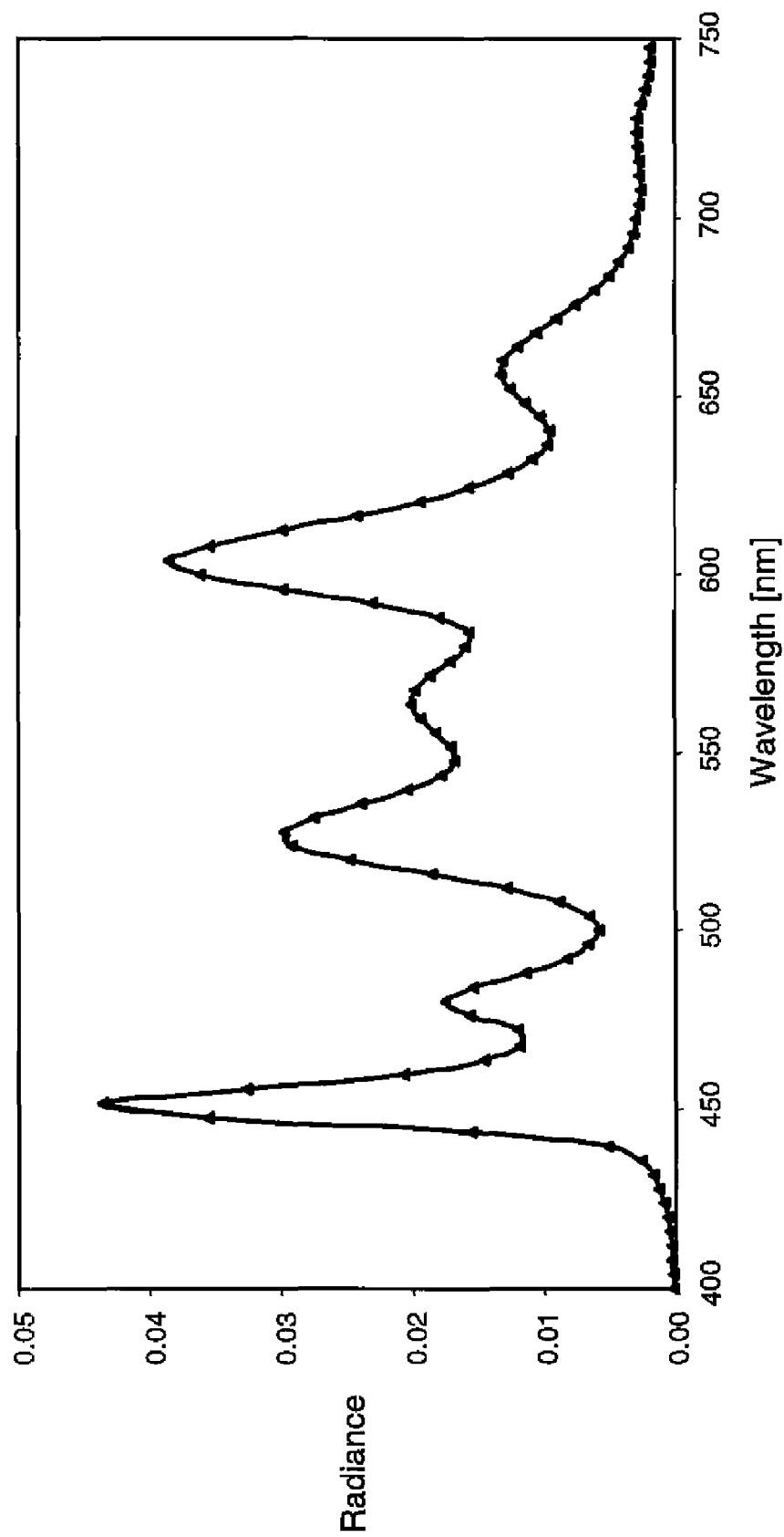
FIG. 4 shows the electroluminescence spectrum of a previously disclosed white OLED device having red, green, and blue emitting layers.

The emission spectrum is shown in FIG. 4. This device had luminance efficiency of 7.2 cd/A and a 69% NTSC color gamut as calculated using the filters of FIG. 6. So, although the color gamut of Example 2 was better than Example 1, the luminance efficiency was worse. In order to provide an intermediate or compromise performance position in a tandem structure, tandem devices were constructed that basically used one of each kind of white EL unit. However, as will be shown below, it was unexpectedly found that the order of these units relative to the reflective electrode was important.

Example 3

Comparative Tandem Device

This example utilized a "blue/yellow" OLED similar to that of Example 1 and a "green/blue/red" OLED similar to that of Example 2 in a tandem format. In this case, the "blue/yellow" OLED is provided closer to the reflective electrode than the "green/blue/red" OLED. Over a clean glass substrate, an 60 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

First White EL Unit
   a) a 10 nm HIL of Formula M1;
   b) a 10 nm HTL of NPB
   c) a 20 nm red light-emitting layer including 89.5% NPB, 10% Formula C7 and 0.5% Formula A4 (red emitting dopant);
   d) 10 nm green LEL including 89.5% Formula AH1, 10% NPB, and 0.5% Formula D4 as green emitting dopant;
   e) a 20 nm blue LEL including 94% Formula AH, 5% NPB, and 1% BEP (Formula F3) blue emitting dopant;

Connector
   f) 40 nm n-doped layer, including 49% 4,7-diphenyl-1,10-phenanthroline (also known as bathophen or Bphen), 49% Alq as co-host electron-transporting and 2% Li metal;
   g) a 10 nm electron accepting layer of Formula M1;

Second White EL Unit;
   h) a 20 nm HTL of NPB;
   i) 20 nm yellow LEL including 68% NPB, 30% Formula AH3, 2% Formula C7 yellow emitting dopant;
   j) 30 nm blue LEL including 92% Formula AH3, 7% NPB, 1% BEP blue emitting dopant; and
   k) 30 nm EIL including 49% 4,7-diphenyl-1,10-phenanthroline (also known as bathophen or Bphen), 49% Alq as co-host and 2% Li metal.

Over the EIL of the second white EL unit, a 100 nm thick reflective aluminum cathode was vapor deposited.

Figure 5:
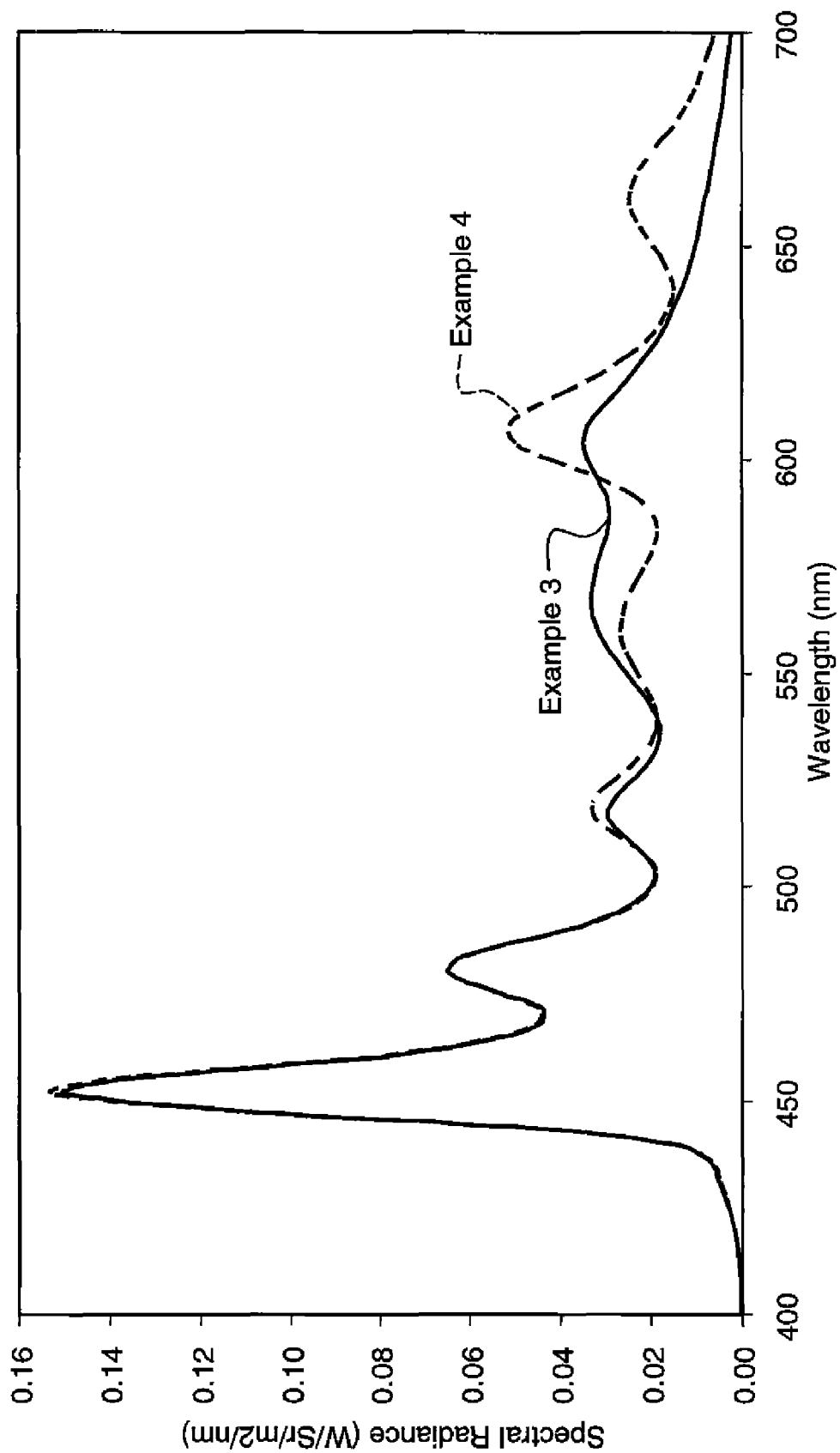
FIG. 5 shows the electroluminescense spectrum of a tandem OLED device made in accordance with the present invention and the electroluminescence spectrum of a comparative tandem OLED device.

The emission spectrum is shown as the solid line in FIG. 5. The luminance efficiency of the unfiltered tandem OLED was 0.129 W/A and the calculated color gamut through the filters of FIG. 6 was 60.8%.

Example 4

Inventive

This is essentially identical to Example 3, but the placement of the two white EL units has been switched. Over a clean glass substrate, an 60 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

First White EL Unit
   a) a 10 nm HIL of Formula M1;
   b) a 10 nm HTL of NPB
   c) 20 nm yellow LEL including 68% NPB, 30% Formula AH3, 2% Formula C7 yellow emitting dopant;
   d) 30 nm blue LEL including 92% Formula AH3, 7% NPB, 1% BEP blue emitting dopant;

Connector
   e) 40 nm n-doped layer, including 49% 4,7-diphenyl-1,10-phenanthroline (also known as bathophen or Bphen), 49% Alq as co-host electron-transporting and 2% Li metal;
   f) a 10 nm electron accepting layer of Formula M1;

Second White EL Unit;
   g) a 10 nm HTL of NPB;
   h) a 20 nm red light-emitting layer including 89.5% NPB, 10% Formula C7 and 0.5% Formula A4 (red emitting dopant);
   i) 10 nm green LEL including 89.5% Formula AH1, 10% NPB, and 0.5% Formula D4 as green emitting dopant;
   j) a 20 nm blue LEL including 94% Formula AH1, 5% NPB, and 1% BEP (Formula F3) blue emitting dopant;
   k) 40 nm EIL including 49% 4,7-diphenyl-1,10-phenanthroline (also known as bathophen or Bphen), 49% Alq as co-host electron-transporting and 2% Li metal.

Over the EIL of the second white EL unit, a 100 nm thick reflective aluminum cathode was vapor deposited.

The EL spectrum is shown as the dashed line in FIG. 5. The luminance efficiency of the unfiltered tandem OLED was 0.143 W/A and the calculated color gamut through the filters of FIG. 6 was 65.1%. By providing a white EL unit having the three most intense peaks in red, green, and blue closer to the reflective electrode than the white EL unit having its two most intense peaks in blue and yellow, both higher efficiency and color gamut was unexpectedly achieved.

The invention has been described in detail with particular reference to certain preferred embodiments thereof, but it will be understood that variations and modifications can be effected within the spirit and scope of the invention.

| PARTS LIST | |
|---|---|
| 100 | tandem OLED device |
| 105 | color filter |
| 110 | anode |
| 120.1 | white light-emitting unit |
| 120.2 | white light-emitting unit |
| 130.1 | intermediate connector |
| 150 | substrate |
| 170 | cathode |
| 180 | voltage/current source |
| 190 | electrical conductors |
| 400 | white light-emitting tandem OLED device |
| 410 | hole-injecting layer |
| 420 | hole-transporting layer |
| 425 | hole-transporting layer |
| 430 | yellow light-emitting layer |
| 435 | red light-emitting layer |
| 445 | green light-emitting layer |
| 450 | blue light-emitting layer |
| 455 | blue light-emitting layer |
| 465 | electron-transporting layer |
| 475 | electron-injecting layer |

The invention claimed is:

1. A tandem white light-emitting OLED device comprising:
   a. a spaced anode and cathode wherein the cathode is reflective metal including aluminum or an alloy of aluminum and the anode is a light transmissive conductive metal oxide;
   b. a first white light emitting unit having an emission spectrum that includes a first set of at least two emission peaks that are more intense than any other emission peaks that may be present in the emission spectrum of the first white light-emitting unit, such first set including:
  i. a first blue spectral component having a first blue peak emission wavelength of between 440 and 490 nm; and
  ii. a yellow spectral component having a yellow peak emission wavelength of between 550 and 590 nm;
c. a second white light-emitting unit disposed closer to the reflective metal cathode than the first white light-emitting unit, such second white light-emitting unit having an emission spectrum that includes a second set of at least three emission peaks that are more intense than any other emission peaks that may be present in the emission spectrum of the second white light-emitting unit, such second set including:
  i. a second blue spectral component having a second blue peak emission wavelength of between 440 and 490 nm;
  ii. a green spectral component having a peak emission wavelength of between 500 and 540 nm; and
  iii. a red spectral component having a peak emission wavelength of between 600 and 700 nm; and
d. an intermediate connector disposed between the first and second white light-emitting units.

2. The tandem white light-emitting OLED device of claim 1 wherein the intensity of the yellow peak emission is at least 50% of the intensity of the second blue peak emission.

3. An OLED display device comprising:
a. an array of individually addressable pixels, each pixel including:
  i. a spaced anode and cathode wherein the cathode is reflective metal including aluminum or an alloy of aluminum and the anode is a light transmissive conductive metal oxide;
  ii. a first white light emitting unit having an emission spectrum that includes a first set of at least two emission peaks that are more intense than any other emission peaks that may be present in the emission spectrum of the first white light-emitting unit, such first set including a first blue spectral component having a first blue peak emission wavelength of between 440 and 490 nm a yellow spectral component having a yellow peak emission wavelength of between 550 and 590 nm;
  iii. a second white light-emitting unit disposed closer to the reflective metal cathode than the first white light-emitting unit, such second white light-emitting unit having an emission spectrum that includes a second set of at least three emission peaks that are more intense than any other emission peaks that may be present in the emission spectrum of the second white light-emitting unit, such second set including a second blue spectral component having a second blue peak emission wavelength of between 440 and 490 nm a green spectral component having a peak emission wavelength of between 500 and 540 nm, and a red spectral component having a peak emission wavelength of between 600 and 700 nm; and
  iv. an intermediate connector disposed between the first and second white light-emitting units; and
b. an array of at least red, green, and blue color filters associated with the array of pixels that receives light from the white light-emitting units, the band pass of each of the color filters being selected to produce red, green, or blue colored light.

4. The OLED display device of claim 3 wherein the frill width at half maximum for each of the blue, green, and red spectral components is within the band pass of the corresponding blue, green, and red color filter.

5. The OLED display device of claim 3 wherein the intensity of the first yellow peak emission is at least 50% of the intensity of the first blue peak emission.

* * * * *